(12) United States Patent
Hulan et al.

(10) Patent No.: US 6,873,528 B2
(45) Date of Patent: Mar. 29, 2005

(54) SUPPLEMENTAL HEAT CONDUCTION PATH FOR CARD TO CHASSIS HEAT DISSIPATION

(75) Inventors: Jamie Hulan, Ottawa (CA); David Perry, Kinburn (CA); Ivan Straznicky, Carleton Place (CA)

(73) Assignee: Dy 4 Systems Ltd., Kanata (CA)

( * ) Notice: Subject to any disclaimer, the term of this patent is extended or adjusted under 35 U.S.C. 154(b) by 227 days.

(21) Appl. No.: 10/208,272

(22) Filed: Jul. 29, 2002

(65) Prior Publication Data

US 2003/0223197 A1 Dec. 4, 2003

Related U.S. Application Data

(60) Provisional application No. 60/383,853, filed on May 28, 2002.

(51) Int. Cl.[7] ................................................. H05K 7/20
(52) U.S. Cl. ...................... 361/719; 361/711; 361/714; 361/727; 174/16.3
(58) Field of Search ................................. 257/718, 719, 257/726, 727; 174/16.3; 429/485, 487; 165/80.3, 185; 211/41.17; 403/409.1; 361/796–798, 801, 704, 705, 707–712, 715–719

(56) References Cited

U.S. PATENT DOCUMENTS

| 4,994,937 | A | * | 2/1991 | Morrison | 361/715 |
| 5,057,968 | A | * | 10/1991 | Morrison | 361/700 |
| 5,414,592 | A | * | 5/1995 | Stout et al. | 361/704 |
| 5,859,764 | A | * | 1/1999 | Davis et al. | 361/704 |
| 6,212,075 | B1 | * | 4/2001 | Habing et al. | 361/719 |
| 6,239,972 | B1 | * | 5/2001 | Tehan et al. | 361/704 |

* cited by examiner

Primary Examiner—Michael Datskovsky
(74) Attorney, Agent, or Firm—ZITO tlp; Joseph J. Zito; Kendal M. Sheets

(57) ABSTRACT

A heat dissipation element which can be shaped as a flat plate for transfer of heat to the opposite side of a mounting channel in a chassis for holding circuit cards. Circuit cards are typically held in place in channels in a chassis by an expansion type retention device. The circuit cards also include a heat frame for collecting the heat produced by the card components and channeling the heat from the card through the heat frame to the chassis. The retention device presses the heat frame in to thermal contact with one side of the channel. The heat dissipation plate is held in thermal contact with the other side of the channel, providing a second additional heat path to channel heat away from individual components, the circuit card and/or the heat frame.

17 Claims, 6 Drawing Sheets

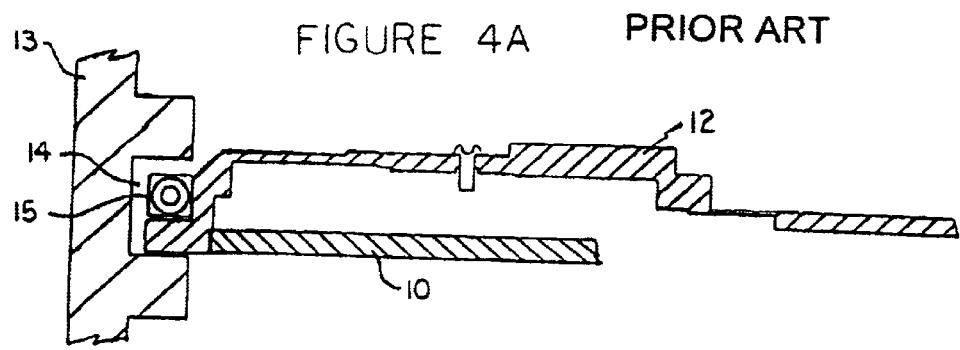
FIGURE 4A PRIOR ART
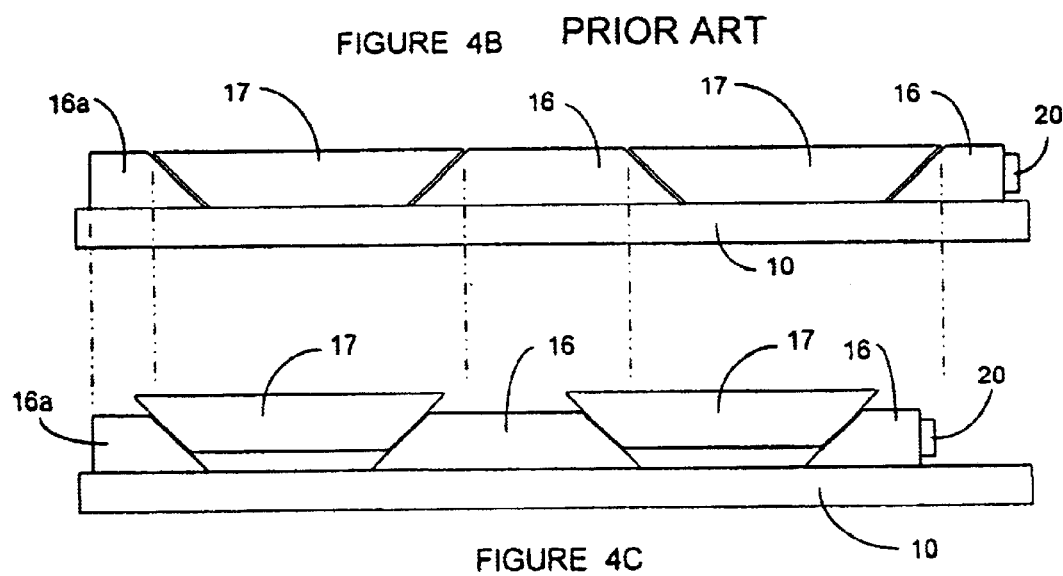
FIGURE 4B PRIOR ART
FIGURE 4C PRIOR ART
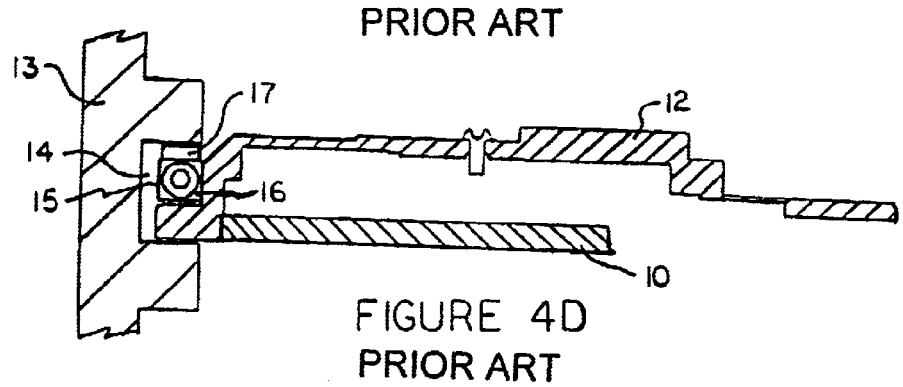
FIGURE 4D PRIOR ART

SUPPLEMENTAL HEAT CONDUCTION PATH FOR CARD TO CHASSIS HEAT DISSIPATION

RELATED APPLICATIONS

This application claims the benefit of Provisional Application No. 60/383,853 filed May 28, 2002.

BACKGROUND OF THE INVENTION

The present invention relates to the mounting of circuit card assemblies (CCA's) in a chassis or enclosure and to the maintenance of proper operating temperatures of mounted (CCA's). More specifically, the present invention relates to heat transfer structures for removing operational heat from a circuit card through conduction of the heat to the surrounding chassis, during operation.

It is common for CCA's to be mounted in a structure that is referred to as a chassis 13, FIG. 1. The chassis includes a number of parallel guide channels 14 for accommodating a number of CCA's 10. The individual cards 10 are slid into the chassis 13 along the channels 14 and electrically connected to the unit at the backplane. It is important in many applications to insure that each of the cards 10 are held in place in the channels 14 to ensure proper electrical connection, to improve heat conduction and to prevent damage to the cards which can arise from motion. Movement of the card can cause connections to the card to be broken resulting in card and/or system failure. A common method of securing circuit cards in place is to use a retaining device 15 which expands to create a tight fit within the channel 14, such as a wedge lock which is expanded once the card 10 is positioned in a channel 14 to wedge the card in place against the walls of the channel.

The use of multiple circuit and high-power or densely packed components can often result in the production of heat which cannot be easily dissipated. Excess heat will create temperatures above a normal or acceptable operating temperature range with the potential for improper operation, card failure or system failure. The individual components on a circuit card produce heat that must be conveyed away from the components and from the circuit card so that the temperatures of the components do not exceed their maximum operating temperatures. Because of the amount of heat generated by the components, and the closely spaced circuit cards and limitations on the chassis, which may include sealing the chassis due to harsh environmental conditions, such as military and/or aerospace applications, the heat must be removed by condition. As the sizes of the components become smaller and the spacing becomes tighter, the power dissipation per area increases and the heat removal problem becomes greater.

Heat can be conducted away from the individual components along the plane of the printed circuit card. As illustrated in FIG. 2, a printed circuit card 10 can include metal strips 11 along one or more edges of the card which make contact with a heat transfer frame 12 attached to the card to conduct heat from the circuit card to the chassis 13. CCA's designed for use in high-temperature environments often also incorporate heat dissipation channels in the circuit card to conduct heat away from individual components along the plane of the card to the heat dissipation strips 11 along the edge of the circuit card. These heat conducting strips 11, often metal pads, are located on an outer surface of the card 10 and are in contact with a heat dissipation frame 12, FIG. 3, which contacts one side of the parallel channel 14 of the chassis 13 when the card is mounted in the chassis channel 14 and held in place with a wedge lock device 15. As illustrated in FIG. 4, the heat dissipation frame is located on the side opposite from the wedge lock device 15 so that the frame is in direct contact with the wall of the channel 14 in the chassis 13.

The heat dissipation frame 12 may be an open frame which contacts the edge of the card or can include planer elements 18 which may be shaped to come in contact with one or more components 19 on the card 13 to directly conduct heat away from the components 19 to the frame 12. A portion of the frame is positioned in contact with the chassis 13 so as to conduct heat from the frame 12 to the chassis. The contact between the frame and the chassis is maintained by the wedge lock device 15. However, the frame is only in contact with one side of the channel, thereby limiting the conductive channel for the removal of heat.

As illustrated in FIGS. 4A through 4D, although the wedge lock 15 is in contact with the heat dissipation frame 12 and the chassis 13, it is a poor conductor of heat because the bottom segments 16 and top segments 17 of the wedge lock are not in good thermal contact with each other. FIGS. 4A and 4B illustrate the wedge lock before expansion. Bottom segments 16 are connected to the card and but can slide laterally when the wedge lock is expanded as illustrated in FIGS. 4C and 4D. Bottom segment 16a is attached to the card 10 and does not move laterally. When the wedge lock 15 is expanded to secure the card 10 in position, the top segments 17 are pushed up away from the bottom segments 16 and also move laterally. The resulting spacing between segments and the spacing between upper segments 17 and the card 10, results in a loss of thermal conductivity. The bottom 16 of the wedge lock contacts the heat frame 12 but the top of the wedge lock does not conduct heat well to the opposite side of the channel of the chassis 13. As illustrated in FIG. 4B, the wedge lock 15 has a hollow interior 9 to accommodate the central spindle 8 of the wedge lock. The hollow interior 9 of the wedge lock 15 also reduces thermal conductivity.

SUMMARY OF THE INVENTION

The present invention teaches the provision of a second parallel surface as a parallel heat conduction channel for conducting heat from the frame 12 to the chassis 13 thereby increasing the size of the conductive area or path for the removal of heat from a circuit card to a chassis. The present invention teaches a heat dissipation plate 21, FIG. 5, attached to the heat frame 12 and inserted between the upper segments 17 of the wedge lock 15 and the side of the channel 14, FIG. 6. The heat dissipation frame 12 of the prior art conducts heat to only one side of a channel 14. The second parallel path heat dissipation plate 21 of the present invention, provides a parallel heat conductive path from the frame 12 to the opposite side of the channel 14 thereby increasing the heat dissipation capacity of the frame 12. The present invention also allows decoupling of heat dissipating elements on the circuit card.

The second heat plate 21 has a flange 22 which is positioned between the upper segments 17 of the wedge lock 15 and the inside of the channel 14 in the chassis 13, as illustrated in FIGS. 5 and 6. The second heat plate 21 extends from the channel 14 and into contact with the heat dissipation frame 12, FIG. 6.

Alternatively, plate 21 can be attached directly to hot components for more direct path to chassis and for decoupling. The plate 21 can therefore provide an alternative heat path from specific heat sources decoupling those sources from the primary heat path.

Positioning the second heat path 21 on the opposite side of the wedge lock 15, in direct contact with the side of the channel 14, allows heat to be conducted to the opposite side of the channel thereby increasing the heat carrying capacity from the heat dissipation frame 12 to the chassis 13. Heat plate 21 may be attached to the thermal frame 12 as such to conduct heat collected by the frame to the opposite side of channel 14. The heat plate 21 is in contact with the heat dissipation frame 12 to conduct the heat already collected by the frame 12 to the opposite side of the channel 14.

Additionally, the heat plate 21 can also include portions directly in contact with components on the card to collect additional heat from the card and conduct it to the chassis 13 for dissipation in addition to the heat frame 12.

The top side heat plate 21 can also incorporate stress relief cuts to accommodate specific applications of the heat shunt where the shunt is attached to a ridged heat frame and/or card components and stress relief pattern may be necessary to achieve the necessary flexibility at the flange which is clamped by the wedge lock.

BRIEF DESCRIPTION OF THE DRAWINGS

For a better understanding of the nature of the present invention, reference is had to the following figures and detailed description, wherein like elements are accorded like reference numerals, and wherein:

FIGS. 4A through 4D are side cutaway views of a wedge lock in combination with a card and a channel in a chassis.

DETAILED DESCRIPTION OF PREFERRED EXEMPLARY EMBODIMENTS

The heat plate 21 of the present invention, is made of rigid, semi-rigid or flexible, heat conductive material such as copper or an alloy commonly used in construction of heat dissipation frames. The plate is thin to allow for the flexibility necessary when the wedge lock 15 is moved into position. The flange 22 of the plate 21 can be a single continuous piece positioned between the wedge lock and the channel or it can have cut outs and notches to allow for greater flexibility. The upper segments 17 of the wedge lock 15 move laterally when the wedge lock is expanded and the heat plate must be constructed to accommodate the lateral movement of the wedge lock segments.

Figure 1:
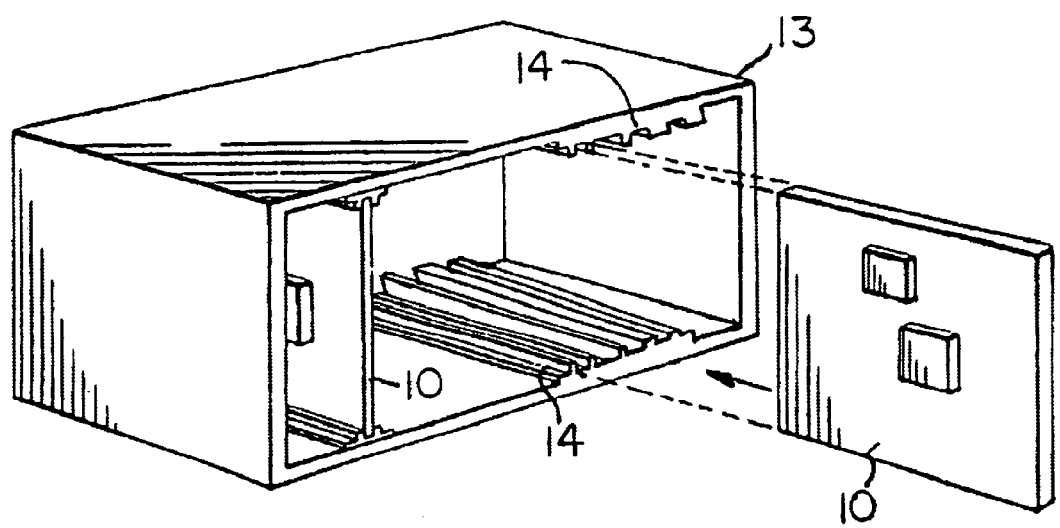
FIG. 1 is a perspective view of a chassis with channels to accommodate cards.
Figure 2:
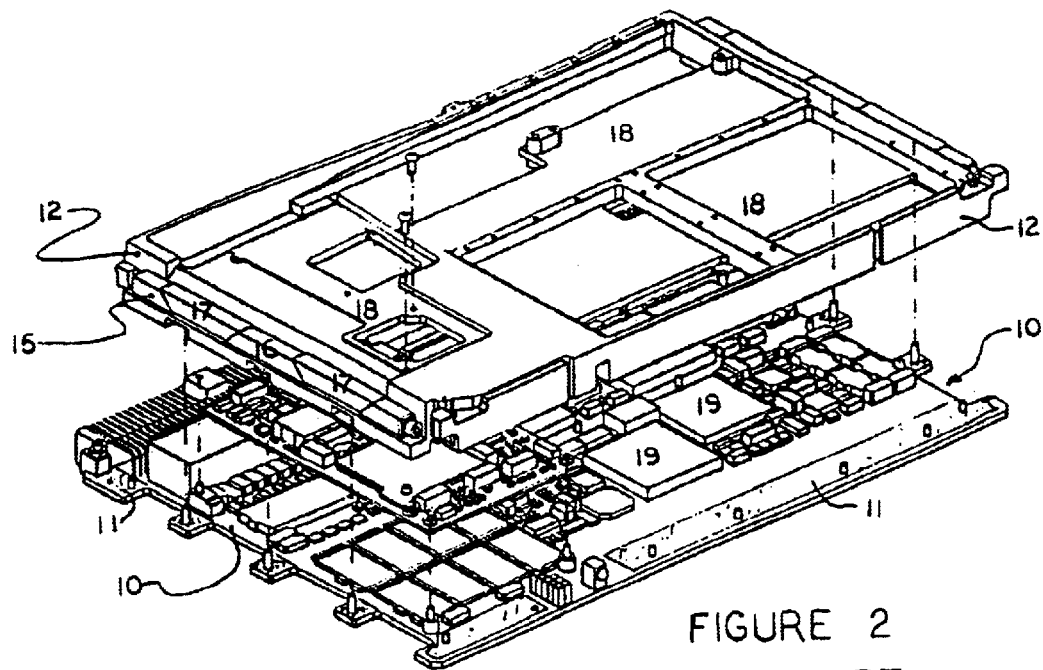
FIG. 2 is a top perspective view of a prior art circuit card and heat dissipation frame.
Figure 3:
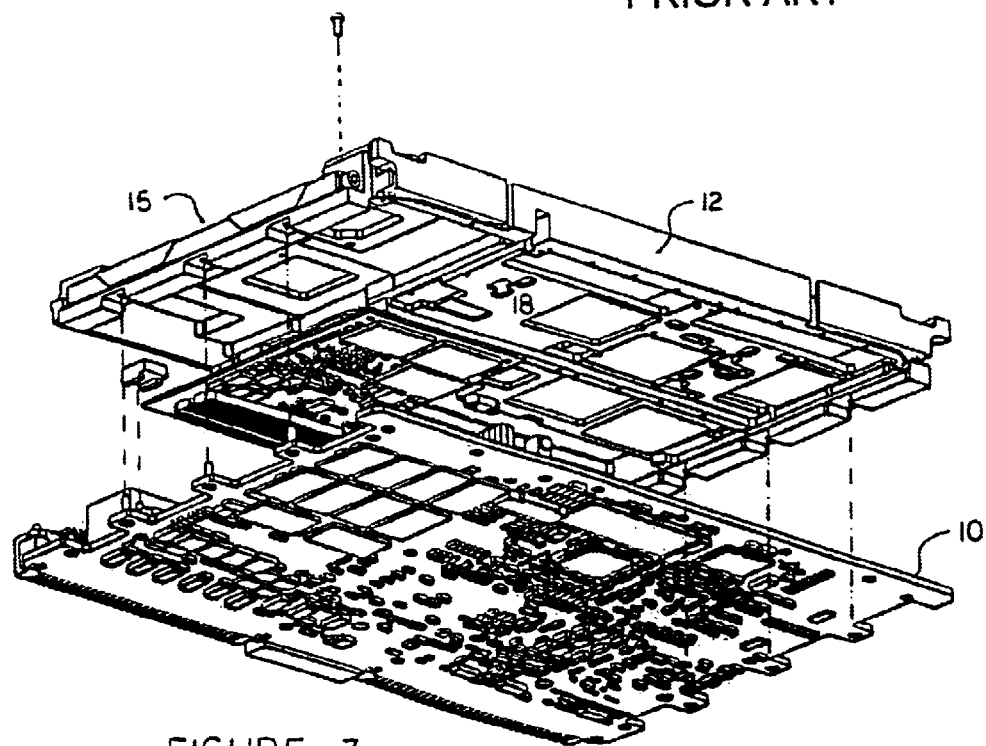
FIG. 3 is a bottom perspective view of a prior art circuit card and heat dissipation frame.
Figure 5:
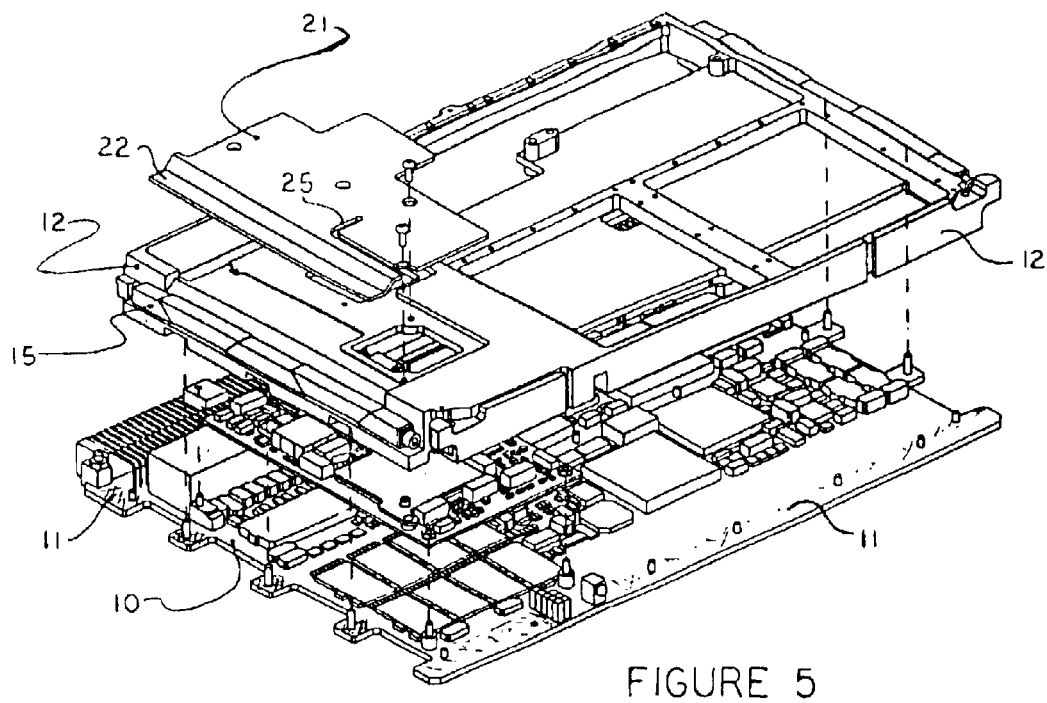
FIG. 5 is a top perspective assembly view of the heat plate of the present invention and a heat dissipation frame and card.
Figure 7:
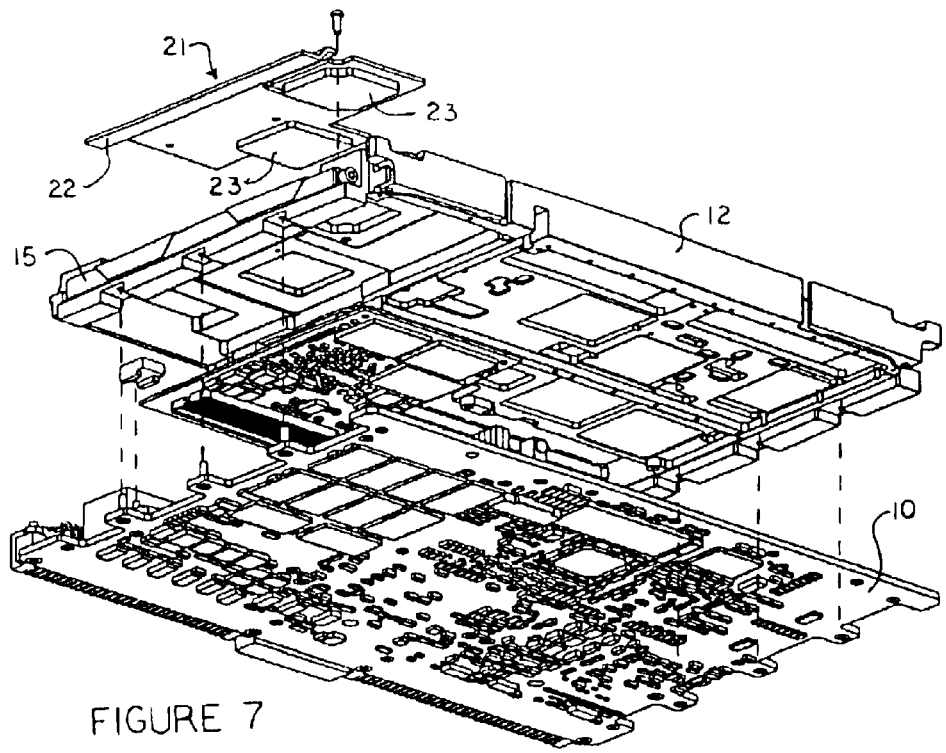
FIG. 7 is a bottom perspective assembly view of a heat plate of the present invention illustrating shaped protrusions for direct thermal contact with specific card mounted components.
Figure 6A:
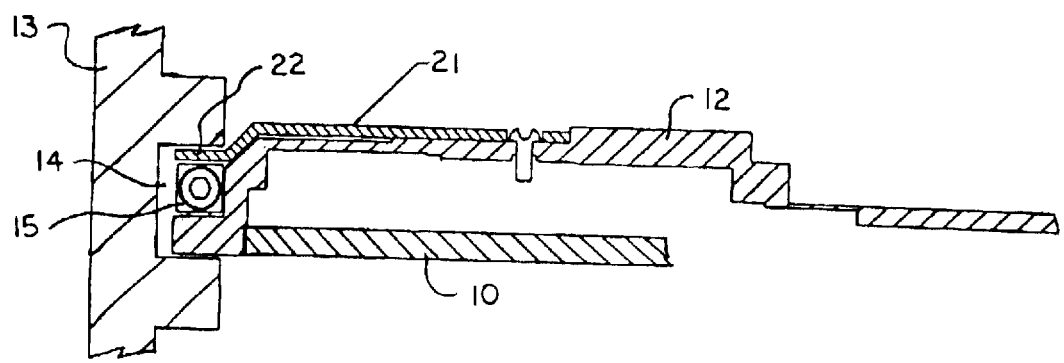
FIGS. 6A and 6B are side cut away views of the heat plate of the present invention in thermal communication with a heat frame and a channel wall of a chassis.
Figure 6B:
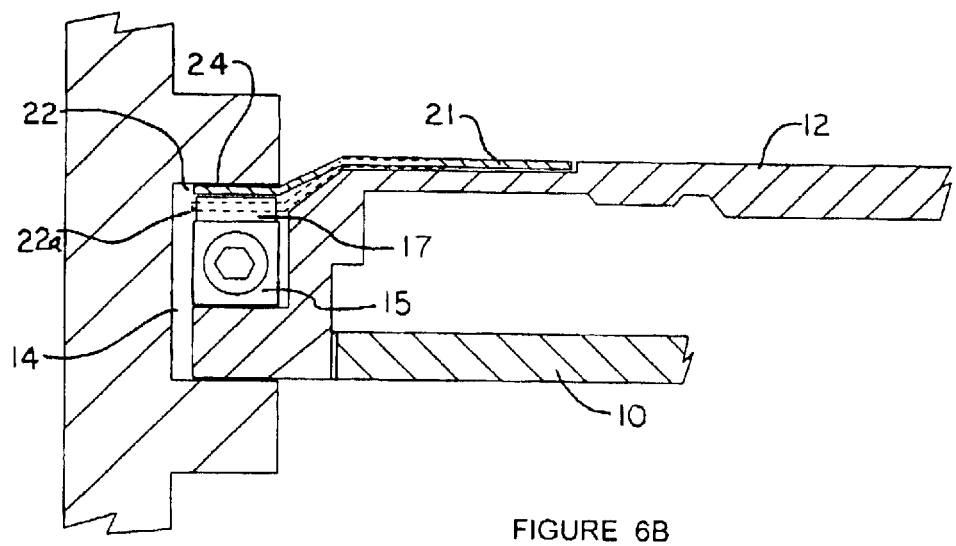

The heat plate 21, as illustrated in FIGS. 5, 6 and 7, extends between the wedge lock 15 and the wall of channel 14. As illustrated in FIG. 6B, flange 22 will flex slightly when the wedge lock is expanded to secure the card 10 into position. The plate 21 is constructed so that flange 22a, illustrated in broken line, is in close proximity with the wall 24 of channel 14 prior to expansion of the wedge lock 15. Wedge lock upper sections 17 extend to clamp flange 22 against the wall 24 of the channel 14. Shaping the plate 21 to maintain flange 22a in close proximity to the wall 24 minimizes the flexing of the plate 21. Reduced flexing minimizes the expanding force required by the wedge lock 15 and reduces the deformation of the flange 22. Because of the flexibility of flange 22, the plate 21 remains in thermal contact with frame 12.

As illustrated in FIG. 5, the plate 21 can be configured to fit into a recess in frame 12. The plate 21 can be attached to the frame 12 by any conventional means such as by screws or other fasteners. The plate 21 can also be bonded to the frame 12 by weldment techniques compatible with the materials used, adhesive or welded or brazed to the frame 12.

FIG. 7 illustrates a number of protrusions 23 on the lower surface of the plate 21. The protrusions 23 correspond to specific components on the card 10 and are provided to make direct thermal contact with chosen components to aid in heat dissipation. The plate 21 of the present invention does not need to contact any components in order to fall within the teachings of the present invention. However, in some applications it may be desirable to modify the plate to include portions of direct contact with specific components.

FIG. 5 illustrates a slot 25 in the plate 21. Plate 21 can be provided with specific design elements which aid in contact with the frame 12 or components on the card 10 while maintaining flexibility in contacting the channel wall 24. The slot 25 is not necessary for the teachings of the present invention but is illustrative of an exemplary embodiment for providing additional flexibility, if desired.

Figure 8:
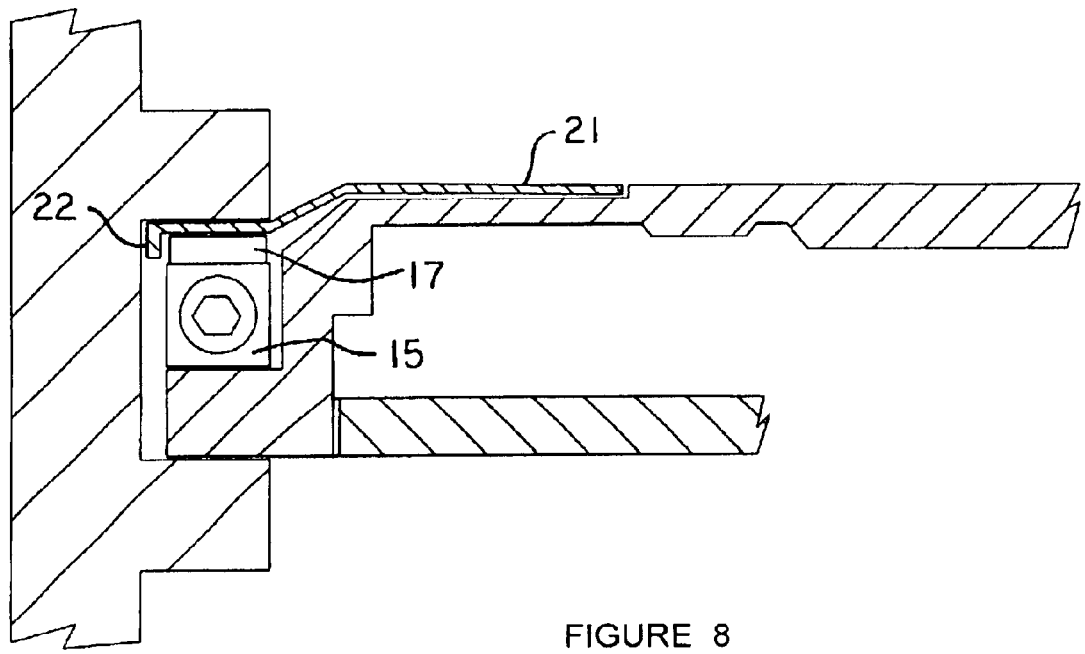
FIGS. 8 and 9 are side cross-sectional views of alternative embodiments of the present invention.
Figure 9:
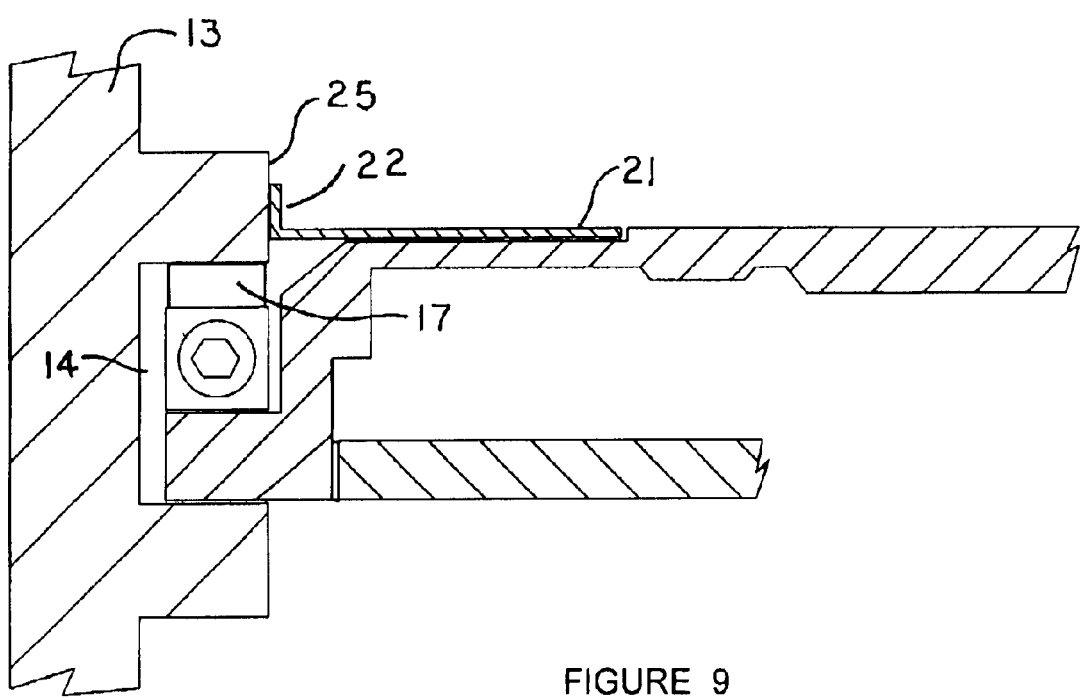

FIG. 8 illustrates an alternative embodiment of the present invention wherein the flange portion 22 of the plate 21 extends beyond upper section 17 of the wedge lock 15. FIG. 9 illustrates an alternative embodiment wherein the flange 22 of the plate 21 is not placed between the wedge lock portion 17 and the side 24 of the channel 14. The flange is attached to a surface 25 of frame 12 by adhesion, using any well known heat conductive adhesive and/or weld mount techniques compatible with the materials used and know in the industry. Both of the alternative embodiments are within the broad scope of the teachings of the present invention. The present invention teaches the provision of a second parallel heat path to the opposite side of the channel 14. The primary exemplary embodiment and the alternative embodiments teach the construction of a plate 21 which will provide this secondary heat transfer path.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting sense.

We claim:

1. A heat dissipation element combined with a heat dissipation frame and an expansion type retaining device mounting a circuit card in a channel of a chassis improving the conduction of heat from the circuit card, comprising:

a planar portion in thermal contact with said heat frame and extending substantially parallel to a plane of said circuit card; and a flange, attached to said planar portion, in thermal contact with a first side of said channel, wherein said retaining device secures said circuit card into the channel, said heat frame is in thermal contact with a second side of said channel, and said first side of said channel in which said flange is in thermal contact with is an opposite side of said channel when said retaining device is engaged.

2. The heat dissipation element of claim 1, wherein said retaining device comprises:

a first base portion in contact with said frame for pressing said frame into thermal contact with a first side of said channel; and movable segments for pressing against the opposite side of said channel to retain said frame and circuit card in said channel, wherein said flange of said heat dissipation element is positioned between said movable segments and said opposite side of said channel.

3. The heat dissipation element of claim 1, wherein said planar portion is also in direct thermal contact with an individual component on said circuit card.

4. A heat dissipation element combined with a heat dissipation frame and an expansion type retaining device mounting a circuit card in a channel of a chassis improving the conduction of heat from the circuit card, comprising:

a flange, connected to said heat dissipation element, which thermally contacts an opposite side of said channel from said frame, and a planar portion, extending from said flange into thermal contact with heat sources on said circuit card; and an extension member, thermally connected to the flange that extends into an area between the retaining device and a bottom of the channel, wherein said retaining device secures said circuit card into the channel.

5. The heat dissipation element of claim 5, wherein said heat transfer path portion is also in thermal contact with said heat dissipation frame.

6. The heat dissipation element of claim 4, wherein said flange is positioned between said retaining device and a bottom of said channel.

7. The heat dissipation element of claim 1, wherein the flange is in contact with the first side wall of the channel, the heat dissipation frame is in contact with a second side wall of the channel, and the retaining member is positioned between the heat dissipation frame and the flange to secure the flange and the heat dissipation frame in the channel.

8. A heat conduction device for conducting heat to a chassis frame, comprising:

a channel, located in the chassis frame, comprising a first side wall, a second side wall, and a bottom, receiving a circuit card;

a heat dissipation frame, thermally connected to the circuit card, comprising an end that is positioned adjacent to the first side wall of the channel;

a retaining device, connected to the heat dissipation frame, securing the heat dissipation frame and the circuit card into the channel;

a planar portion thermally connected to the heat dissipation frame; and a flange, thermally connected to the planar portion, that is positioned in the channel between the retaining device and the second side wall of the channel, wherein the flange thermally contacts the first side wall of the channel, the heat dissipation frame thermally contacts the second side wall of the channel, and the retaining member is positioned between the heat dissipation frame and the planar portion to secure the planar portion and the heat dissipation frame in the channel.

9. The heat conduction device of claim 8, wherein the heat dissipation member is wedged against the second side wall by the retaining member.

10. The heat conduction device of claim 8, wherein the heat dissipation member comprises a stress relief area to provide flexibility when the retaining member secures the heat dissipation member and the circuit card into the channel.

11. The heat conduction device of claim 8, wherein the heat dissipation member thermally connects to a component on the circuit card.

12. The heat conduction device of claim 8, wherein the heat dissipation member comprises a heat dissipation plate.

13. The heat conduction device of claim 8, further comprising:

an extension member, thermally connected to the flange, that extends into an area between the retaining device and the bottom of the channel.

14. The heat conduction device of claim 8, further comprising:

a chassis that forms a frame for the channel, wherein the flange is attached to the chassis.

15. The element of claim 1, wherein the planar portion comprises a stress relief area to provide flexibility of the planar portion when the retaining member secures the heat dissipation frame and the circuit card into the channel.

16. The element of claim 1, further comprising:

an extension member, thermally connected to the flange, that extends into an area between the retaining device and a bottom of the channel.

17. The element of claim 4, wherein the planar portion comprises a stress relief area to provide flexibility of the planar portion when the retaining member secures the heat dissipation frame and the circuit card into the channel.

* * * * *